United States Patent
Becker et al.

(10) Patent No.: US 7,029,803 B2
(45) Date of Patent: Apr. 18, 2006

(54) ATTENUATING PHASE SHIFT MASK BLANK AND PHOTOMASK

(75) Inventors: Hans Becker, Meiningen (DE); Ute Buttgereit, Zella-Mehlis (DE); Gunter Hess, Meiningen (DE); Oliver Goetzberger, Meiningen (DE); Frank Schmidt, Jena (DE); Frank Sobel, Meiningen (DE); Markus Renno, Meiningen (DE); S. Jay Chey, Ossining, NY (US)

(73) Assignees: Schott AG, Mainz (DE); IBM, Armonk, NY (US)

( * ) Notice: Subject to any disclaimer, the term of this patent is extended or adjusted under 35 U.S.C. 154(b) by 94 days.

(21) Appl. No.: 10/655,593

(22) Filed: Sep. 5, 2003

(65) Prior Publication Data

US 2005/0053845 A1    Mar. 10, 2005

(51) Int. Cl.
*G01F 9/00* (2006.01)

(52) U.S. Cl. ....................................................... 430/5

(58) Field of Classification Search ............... 430/5, 430/322; 428/433; 378/35
See application file for complete search history.

(56) References Cited

U.S. PATENT DOCUMENTS

| | | | |
|---|---|---|---|
| 5,472,811 A * | 12/1995 | Vasudev et al. | 430/5 |
| 5,477,058 A | 12/1995 | Sato | |
| 5,635,315 A | 6/1997 | Mitsui | |
| 5,897,977 A | 4/1999 | Carcia et al. | |
| 5,939,225 A | 8/1999 | Dove et al. | |
| 5,942,356 A | 8/1999 | Mitsui et al. | |
| 6,274,280 B1 * | 8/2001 | Carcia | 430/5 |
| 6,458,495 B1 * | 10/2002 | Tsai et al. | 430/5 |
| 6,458,496 B1 | 10/2002 | Motonaga et al. | |
| 2002/0122991 A1 | 9/2002 | Shiota et al. | |

FOREIGN PATENT DOCUMENTS

JP          04068352          3/1992

OTHER PUBLICATIONS

Burn J. Lin, "The Attenuated Phase-Shifting Mask", Solid State Technology, Jan. issue, pp. 43–47, (1992).

* cited by examiner

*Primary Examiner*—S. Rosasco
(74) *Attorney, Agent, or Firm*—Millen, White, Zelano, Branigan, P.C.

(57) ABSTRACT

The present invention relates to attenuating phase shift mask blanks for use in lithography, a method of fabricating such a mask blank.

50 Claims, 9 Drawing Sheets

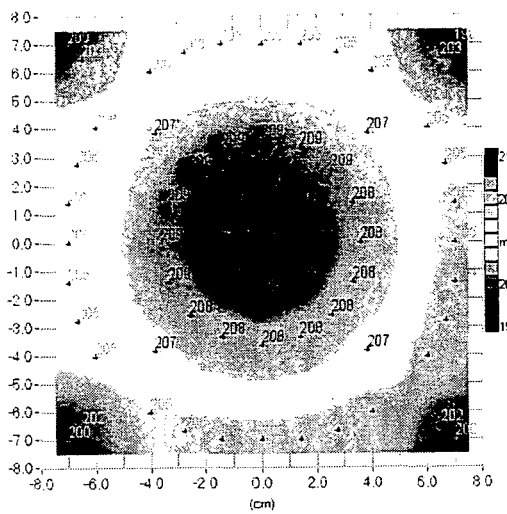
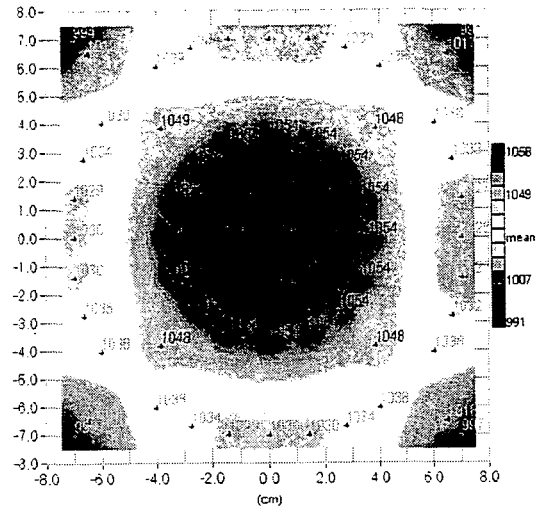
Fig. 8a                    Fig. 8b
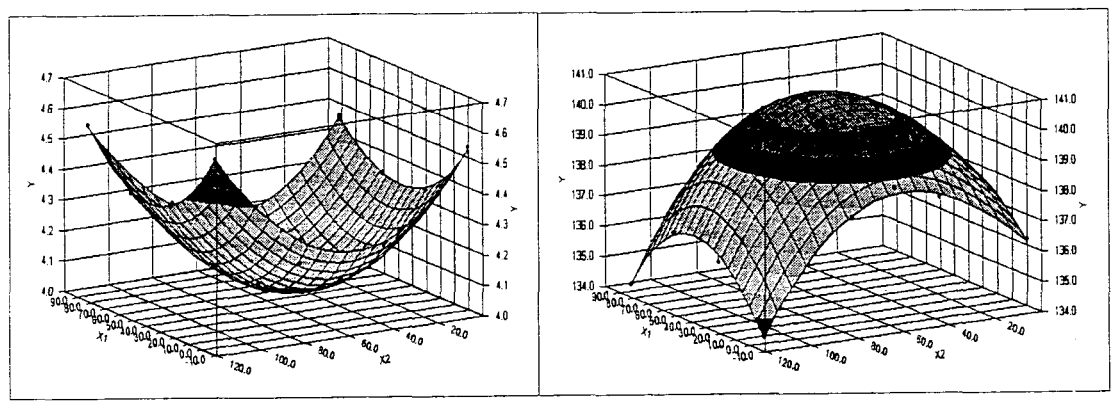
Fig. 9a                    Fig. 9b

ATTENUATING PHASE SHIFT MASK BLANK AND PHOTOMASK

FIELD OF THE INVENTION

The present invention relates to attenuating phase shift mask blanks for use in lithography for an exposure wavelength of 200 nm or less, and a method of fabricating such a mask blank.

BACKGROUND OF THE INVENTION

There is considerable interest in phase shift masks as a route to extending resolution, contrast and depth focus of lithographic tools beyond what is achievable with the normal binary mask technology. Among the several phase shifting schemes, the (embedded) attenuating phase shift masks proposed by Burn J. Lin, Solid State Technology, January issue, page 43 (1992), the teaching of which is incorporated herein by reference, is gaining wider acceptance because of its ease of fabrication and the associated cost savings.

Several technical variations of attenuated phase shift masks have been proposed. In a first variation, the substrate is provided with a slightly transparent layer, e.g. a very thin chrome layer, coupled with etching into the quartz substrate to produce the desired phase shift. This method requires a high degree of control of both layer deposition and the etch process. In other variations, a phase shift mask is provided by applying one or more layers with phase shifting and attenuating properties on the substrate. There have been proposed single layer solutions in which one layer provides the 180° phase shift as well as the attenuation of the incident light. Such single layer solutions are e.g. described in U.S. Pat No. 5,942,356, U.S. Pat. No. 5,635,315, U.S. Pat. No. 6,503,644, U.S. Pat. No. 5,939,225, U.S. Pat. No. 5,477,058 and U.S. Ser. No. 2002/0119378 A1. Single layer solutions had been chosen due to their simple structure and, therefore, their easier preparation. However, single layer solutions are limited in view of an independent tuneability of transmission and phase shift. In particular, high transmission attenuated phase shift mask blanks for an exposure wavelength of 193 nm and phase shift mask blanks for an exposure wavelength of 157 nm cannot be achieved. Besides single layer solutions, bilayer and multilayer attenuating phase shift mask blanks have also been described. Multilayers have been described e.g. in U.S. Pat. No. 5,897,977 and U.S. Pat. No. 6,274,280. U.S. Pat. No. 5,897,977 relates to embedded attenuating phase shift mask blanks (EAPSM) for wavelength of less than 400 nm comprising distinct alternating layers of an optically transparent material such as a metal oxide, metal nitride oralkaline earth fluoride and layers of an optically absorbing material, such as an elemental metal, metal oxide or metal nitride. U.S. Pat. No. 6,274,280 describes EAPSM for exposure wavelengths of less than 200 nm comprising distinct alternating contiguous layers of an optically transparent material consisting essentially of an oxide selected from the group consisting of oxides of Al and Si and layers of an optically absorbing material consisting essentially of a nitride selected from the group consisting of nitrides of Al and Si. Single and multilayer solutions for phase shift mask blanks for exposure wavelength of less than 160 nm are also described in U.S. Pat. No. 6,395,433. The phase shift system comprises at least one material with at least silicon, silicon oxide or silicon nitride and absorbing metal oxides or nitrides to decrease the transmission properties of the phase shift mask blank. This document stresses that each of the layers of the multilayer should be sufficiently thin to result in a multilayer acting as a pseudo single layer. Multilayer solutions are less preferred for exposure wavelengths less than 200 nm since defects cannot be repaired.

Several publications mention bilayer phase shift mask blanks: JP 04-068352 A relates to a phase shift mask having a high accuracy that can be easily inspected and corrected. U.S. Ser. No. 2002/0122991 A1 describes single layer and bilayer halftone phase shift mask blanks comprising a phase shift layer constituted of silicon, oxygen and nitrogen. Optionally, an etch stop layer provided between the substrate and the phase shift layer. The transmission of the phase shift layer is adjusted by changing the ratio of oxygen and nitrogen in the phase shift layer. According to this document, if the range of nitrogen in the phase shifter layer is less than 5 atomic % or the range of oxygen exceeds 60 atomic %, the transmittance of the film is too high and the function of the halftone phase shift layer is lost. U.S. Pat. No. 5,482,799 relates to a bilayer phase shift mask blank wherein the phase shift layer includes a monolayer formed of an approximately homogeneous material and a transmitting film whose transmittance is less dependent on the wavelength when used in combination with said monolayer film. Such a dependency on the optical properties of one layer of a phase shift system from another layer of a phase shift system is disadvantageous for a phase shift system in that the phase shift and transmittance can not be tuned independently. U.S. Pat. No. 6,458,496 describes phase shift mask blank having a bilayer phase shift system. The mask blanks have an improved etching selective ratio to the substrate. TaSiO is described as the preferred material for imposing a phase shift to the phase shift mask blank.

None of the cited documents related to bilayer solutions addresses the problem of defects in the deposited layers or the uniformity of the layers in phase shift mask blanks for exposure wavelengths for 200 nm or less.

With the increasing requirements for the decreasing feature sizes of photomasks, substantially defect free photomask blanks are becoming more and more important. Defects on the photomask blank may lead to defects such as pinholes in the photomask which results in defects in the IC devices. The task to avoid defects on mask blanks is becoming more challenging due to the decrease of the feature sizes. For example, for the 65 and 45 nm nodes (i.e., feature sizes of 65 nm and 45 nm, respectively, on the wafer), a photomask is patterned with structures having a feature size of 100 nm and thus must be free from surface defects having a particle size of more than 0.5 µm.

It is therefore an object of the present invention to provide novel phase shift mask blanks for exposure wavelengths of 200 nm or less that combine the possibility of an easy and stable production with the necessary optical properties, chemical stability as well as a defect free surface and uniformly deposited layers.

SUMMARY OF THE INVENTION

A first aspect of the present invention is an attenuating phase shift mask for use in lithography, comprising a substrate and a thin film system on one surface of said substrate; said thin film system comprising:
  a phase shift layer comprising a phase shift control sublayer and a transmission control sublayer;
  said phase shift mask being able of producing a photomask with substantially 180° phase shift and an optical transmission of at least 0.001% at an exposure light having a wavelength of 200 nm or less;

wherein said thin film system is essentially free of defects having a particle size of 0,5 µm or more.

Preferably the thin film system has at most 50 defects, more preferably at most 20 defects, having a particle size of from 0.3 to 0.5 µm.

Preferably, the phase shift control sublayer substantially does not lower the transmission of the phase shift layer and preferably comprises a material selected from the group consisting of oxides and oxinitrides of Si mixtures thereof. Even more preferably, said phase shift control layer essentially consists of $SiO_2$.

Preferably, the transmission control sublayer substantially does not change the phase shift of the phase shift layer and preferably comprises a material selected from the group consisting of Mg, Si, Y, La, Ti, Zr, Hf, V, Nb, Ta, Cr, Mo, W, Mn, Fe, Co, Ni, Zn, Ge, Sn, Pb, nitrides thereof and mixtures of two or more of these metals or nitrides. According to one embodiment of the present invention, said transmission control sublayer essentially consists of one material selected from Ti, Zr, Hf, V, Nb, Ta, Cr, Mo, W or a nitride thereof.

A second aspect of the present invention is a method of fabricating an attenuated phase shift mask for use in lithography, wherein said phase shift mask comprises a substrate and a thin film system on one surface of said substrate; said thin film system comprises a phase shift layer comprising a phase shift control sublayer and a transmission control sublayer; wherein said thin film system is essentially free of defects having a particle size of 0,5 µm or more; said phase shift mask being able of producing a photomask with substantially 180° phase shift and an optical transmission of at least 0.001% at an exposure light having a wavelength of 200 nm or less;

said method comprising:
providing a substrate; and
providing a thin film system;
wherein providing of a thin film system comprises the steps of
forming a transmission control sublayer on said substrate;
forming a phase shift control sublayer on said substrate.

Preferably the transmission control sublayer and/or the phase shift control sublayer is/are formed by sputter deposition using a technique selected from the group consisting of dual ion beam sputtering, ion beam assisted deposition, ion beam sputter deposition, RF matching network, DC magnetron, AC magnetron, and RF diode. Preferably, xenon is used as a sputtering gas.

A third aspect of the present invention is an attenuating phase shift mask for use in lithography, comprising a substrate and a thin film system on one surface of said substrate; said thin film system comprising:
a phase-shift layer comprising a phase shift control sublayer and a transmission control sublayer;
said phase shift mask being able of producing a photomask with substantially 180° phase shift and an optical transmission of at least 0.001% at an exposure light having a wavelength of 200 nm or less;
wherein the phase shift of said phase shift mask has a deviation from the mean value of at most about ±5° and the transmission of said phase shift mask has a deviation from the mean transmission value of at most about ±5%.

Preferably, the phase shift control sublayer substantially does not lower the transmission of the phase shift layer and preferably comprises a material selected from the group consisting of oxides and oxinitrides of Si mixtures thereof. Even more preferably, said phase shift control layer essentially consists of $SiO_2$.

Preferably, the transmission control sublayer substantially does not change the phase shift of the phase shift layer and preferably comprises a material selected from the group consisting of Mg, Si, Y, La, Ti, Zr, Hf, V, Nb, Ta, Cr, Mo, W, Mn, Fe, Co, Ni, Zn, Ge, Sn, Pb, nitrides thereof and mixtures of two or more of these metals or nitrides. According to one embodiment of the present invention, said transmission control sublayer essentially consists of one material selected from Ti, Zr, Hf, V, Nb, Ta, Cr, Mo, W or a nitride thereof.

A fourth aspect of the present invention is a method of fabricating an attenuated phase shift mask for use in lithography, wherein said phase shift mask comprises a substrate and a thin film system on one surface of said substrate; said thin film system comprises a phase shift layer comprising a phase shift control sublayer and a transmission control sublayer; wherein the phase shift of said phase shift mask has a deviation from the mean value of at most about ±5° and the transmission of said phase shift mask has a deviation from the mean transmission value of at most about ±5%; said phase shift mask being able of producing a photomask with substantially 180° phase shift and an optical transmission of at least 0.001% at an exposure light having a wavelength of 200 nm or less;

said method comprising:
providing a substrate; and
providing a thin film system;
wherein providing of a thin film system comprises the steps of forming a transmission control sublayer on said substrate and forming a phase shift control sublayer on said substrate.

Preferably the transmission control sublayer and/or the phase shift control sublayer is/are formed by sputter deposition using a technique selected from the group consisting of dual ion beam sputtering, ion beam assisted deposition, ion beam sputter deposition, RF matching network, DC magnetron, AC magnetron, and RF diode. Preferably, xenon is used as a sputtering gas.

These and other objects, features and advantages of the present invention will become apparent upon a consideration of the following detailed description and the invention when read in conjunction with the drawing Figures.

It is to be understood that both the forgoing general description and the following detailed description are merely exemplary of the invention, and are intended to provide an overview or framework for understanding the nature and character of the invention as claimed.

BRIEF DESCRIPTION OF THE DRAWINGS

In the Figures.

FIG. 8*a* shows the uniformity of the thickness of the transmission control sublayer of an exemplary mask blank according to the present invention.

FIG. 8*b* shows the uniformity of the thickness of the phase shift control sublayer of an exemplary mask blank according to the present invention.

FIG. 9*a* shows the uniformity of the transmission of an exemplary phase shift mask blank according to the present invention.

FIG. 9*b* shows the uniformity of the phase shift of an exemplary phase shift mask blank according to the present invention.

DETAILED DESCRIPTION OF THE PREFERRED EMBODIMENTS

Figure 1A:
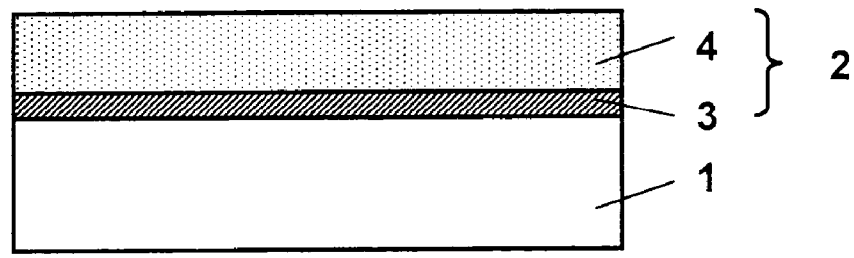
FIG. 1 shows a schematic cross section of a mask blank (FIG. 1a) and mask (FIG. 1c) according to the present invention.
Figure 1B:
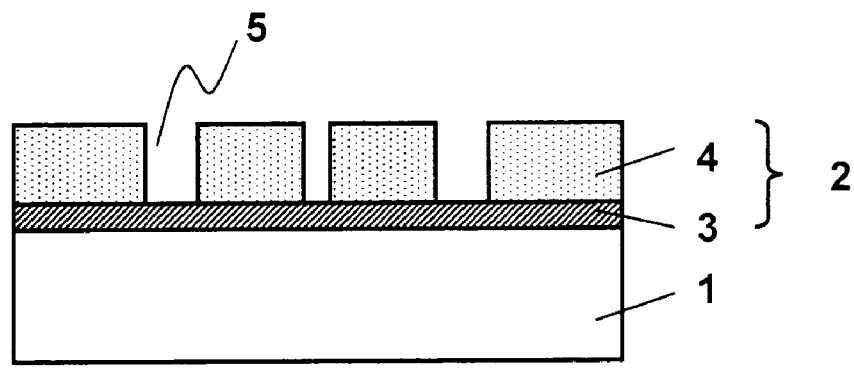

As known in the art, a "photomask blank" or "mask blank" differs from a "photomask" or "mask" in that the latter term is used to describe a photomask blank after it has been structured or patterned or imaged. While every attempt has been made to follow this convention herein, those skilled in the art will appreciate the distinction in not a material aspect of this invention. Accordingly, it is to be understood that the term "photomask blank" or "mask blank" is used herein in the broadest sense to include both imaged and non-imaged photomask blanks.

The expression "having a phase shift of substantially 180°" means that the phase shift mask blank provides a phase shift of the incident light sufficient to cancel out light in the boundary section of a structure and thus to increase the contrast at the boundary. Preferably, a phase shift of 160° to 190°, more preferably of 170° to 185° is provided.

The mask blank of the present invention has a transmission of at least 0.001%, preferably of at least 0.5%, at an exposure light having a wavelength of less than 200 nm.

The phase shift mask or mask blank of the present comprises a substrate and a thin film system provided on one surface of the substrate. Said thin film system comprises at least a phase shift layer as described herein below but may also comprise further layers such as an anti reflective layer or an absorbing layer. As such an absorbing layer, e.g. a chromium or TaN layer may be provided on the phase shift layer of the phase shift mask blank of the present invention.

The present invention relates to an attenuated phase shift mask blank having at least a bilayer phase shift layer. The phase shift layer basically is divided into at least a transmission control sublayer and a phase shift control sublayer. In the state of the art, even in the bi- and multilayer systems at least one layer contributed substantially to both the phase shift function and the attenuating function of the phase shift layer. However, the inventors of the present invention have found that substantially separating the phase shift function and the attenuating function into at least two separate sublayers is particularly advantageous for an attenuating phase shift mask blank for exposure wavelengths of less than 200 nm. Such an attenuated phase shift mask blank can easily be tuned with respect to the transmission of the mask blank without the need of changing the composition of the sublayers but simply by variation of the thickness of the transmission control sublayer. The phase shift of the mask blank can be easily tuned without substantially changing the transmission of the mask blank by varying the thickness of the phase shift sublayer. Tuning of the phase shift of a mask blank often is necessary to adapt the mask blank to the etching process. During such etching process, the substrate is often etched to a defined depth, thus adding an additional phase shift to the phase shift system. In order to adapt the mask blank to this etching into the mask blank, it may be necessary to set the phase shift not to exactly 180° but to a value from about 175° to 180° phase shift depending on the etching process.

If according to the state of the art, the composition of a layer has to be changed to tune e.g. the transmission of the mask blank, the manufacturing parameters, such as gas flow into the apparatus and/or even the target during deposition of the layers requires repeated optimization of the deposition process and thus is accompanied with additional costs.

Thus, the attenuated phase shift mask blank of the present invention comprises a substrate and a phase shift layer, wherein the phase shift layer is composed of a phase shift control sublayer that substantially does not lower the transmission of the mask blank, and a transmission control sublayer that substantially does not change the phase shift of the mask blank.

The wording "substantially not changing the phase shift of the mask blank" means that the phase shift of the mask blank is changed to an amount of at most 15°, preferably at most about 10°, most preferably at most about 5°, of the overall phase shift.

In the state of the art, most layers with a phase shifting function contain substantial amounts of absorbing elements, thus these layers also substantially lower the transmission of the phase shift mask blank. According to the present invention, by the wording "substantially not lowering the transmission of the mask blank" is meant that the phase shift control sublayer lowers the transmission of the mask blank to a value of at most about 10%, preferably at most about 5% of the transmission.

In the following, preferred constructions of an attenuated phase shift mask blank and an attenuating phase shift mask according to the present invention are described.

Referring to FIG. 1*a*, the mask blank according to a preferred embodiment of the present invention comprises a substrate 1 on which a phase shift layer 2 is provided. The phase shift layer 2 is composed of a transmission control sublayer 3 and a phase shift control sublayer 4. Preferably, the transmission control sublayer 3 is provided as the first sublayer of phase shift layer on the substrate 1 and the phase shift control sublayer 4 is provided on the transmission control sublayer as the second sublayer of the phase shift layer as also shown in FIG. 1a. However, according to another embodiment of the present invention, the phase shift control sublayer may be provided as a first sublayer of the phase shift layer on the substrate and the transmission control sublayer is provided as the second sublayer of the phase shift layer on the phase shift control sublayer.

Figure 1C:
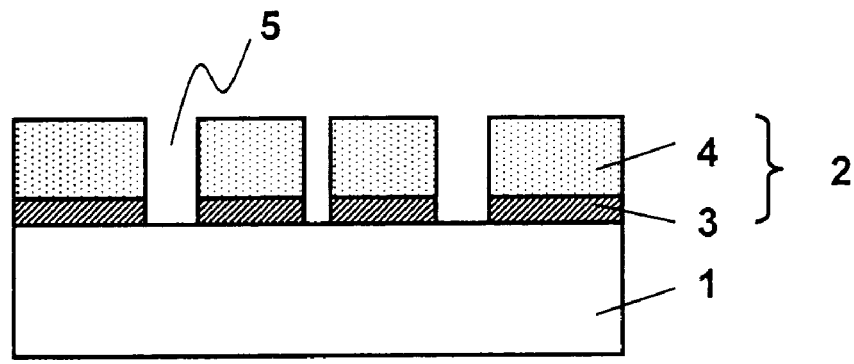

For transforming the phase shift mask blank shown in FIG. 1a into an imaged or patterned or structured photomask as shown in FIG. 1c, preferably, a two step process is preferred. Using imaging techniques known in the state of the art, such as by providing a photoresist on the mask blank and structuring said photoresist, at first the first sublayer of the phase shift layer, preferably the phase shift control sublayer is patterned using a first etching agent. In a second step, the second sublayer of the phase shift layer, preferably the transmission control sublayer is patterned preferably using a second etching agent.

The phase shift control sublayer preferably comprises a material selected from the group consisting of oxides and oxinitrides of Si and mixtures thereof.

By the addition of nitrogen to the phase shift control sublayer, the refractive index of the phase shift control sublayer becomes higher than for a pure silicon dioxide layer. However, since the addition of nitrogen into the silicon dioxide layer may impair the chemical stability of the phase shift control sublayer, nitrogen preferably is added in an amount of at most about 10 at. %, more preferably of at most about 5 at. %.

The phase shift control sublayer may also contain small amounts of metals selected from the group consisting of Mg, Y, La, Ti, Zr, Hf, V, Nb, Ta, Cr, Mo, W, Mn, Fe, Co, Ni, Zn, Ge, Sn, Pb and mixtures thereof. However, since the incorporation of these metals tends to lower the transmission of the phase shift control sublayer, it is preferred that these metals are incorporated only in an amount of at most 5 at. %. Even more preferably, the phase shift control sublayer is free from such metals. Furthermore, phase shift control sublayers containing metals as mentioned above, and in particular in amounts of more than 5 at. % are prone to result in mask blanks having higher defect levels. The incorporation of such metals, in particular in amounts of more than 5 at. %, therefore is also not preferred from the viewpoint of a low defect level of the thin film system of the phase shift mask blank.

According to one embodiment of the present invention, the phase shift control sublayer essentially consists of $SiO_2$.

The phase shift control sublayer has a thickness adjusted to provide a phase shift of about 180° at an exposure light wavelength in the range of 200 nm or less.

The thickness of the phase shift control sublayer necessary to achieve a determined phase shift depends on the refractive index or index of refraction n and the extinction coefficient k of the material the phase shift sublayer is formed of. As a general rule, a material with a higher index of refraction will lead to a larger phase shift per deposited thickness of the phase shift sublayer than a material with a lower index of refraction.

In case the phase shift control sublayer essentially consists of $SiO_2$, the phase shift control layer preferably has a thickness of at least about 130 nm, more preferably at least about 145 nm, and at most about 180 nm, more preferably at most about 160 nm, in case a high transmission attenuated 193 nm phase shift mask blank is to be produced. In case an attenuated 157 nm phase shift mask blank is to be produced, the phase shift control layer preferably has a thickness of at least about 90 nm, more preferably at least 100 nm, and at most 120 nm, more preferably at most about 110 nm.

The transmission control sublayer is formed of at least one material having a high opacity and preferably comprises a material selected from the group consisting of Mg, Si, Y, La, Ti, Zr, Hf, V, Nb, Ta, Cr, Mo, W, Mn, Fe, Co, Ni, Zn, Ge, Sn, Pb, nitrides thereof and mixtures of two or more of these metals or nitrides. More preferably the transmission control layer comprises a material selected from the group consisting of Ta, Ti, Zr, Hf, V, Nb, Cr, Mo, and W. According to one embodiment of the present invention, the transmission control sublayer preferably consists of at least one material selected from the group consisting of Nb, Ta, Ti, Cr, Mo, W, V, Nb, Zn, Zr, Hf, Si, Ge, Sn, Pb, Mn, Fe, Co, Ni, La, Mg, and nitrides and mixtures of two or more of these metals or nitrides thereof. In this context, one material means e.g. one elemental metal, such as a layer of Ti, Ta or Hf, or one metal nitride, such as TaN, TiN or HfN.

The transmission control layer has a sufficient thickness to adjust the transmission of the phase shift layer to the desired value and its thickness essentially depends on the material of the transmission control layer. The thickness can be calculated by the following formula:

$$d_{Tc} = -1/\alpha \times \ln(T/100)$$

wherein T is the desired transmission in %, $\alpha_{80}$ is the absorption coefficient at the exposure wavelength $\lambda$ and $d_{Tc}$ is the calculated thickness of the transmission control layer. The absorption coefficient $\alpha$ relates to the extinction coefficient k according to the following formula:

$$\alpha = 4\pi k_\lambda/\lambda$$

According to a preferred embodiment of the present invention, the transmission control layer is provided directly on the substrate and also provides an etch stop function, i.e. has a different etch selectivity than the quartz substrate. Thus, overetching of the phase shift mask into the quartz substrate can easily be prevented. According to this embodiment of the present invention, the transmission control sublayer has a thickness of preferably at least about 8 nm, most preferably of at least about 10 nm. If the thickness is less than about 8 nm, the etch stop function of the transmission control sublayer is not sufficient.

According to this embodiment of the present invention the transmission control sublayer preferably has an etching selectivity different from the phase shift control sublayer. If the phase shift control layer is etched using a fluorine containing component, the transmission control layer preferably is etched by a dry etching method using a chlorine-based gas such as $Cl_2$, $Cl_2 + O_2$, $CCl_4$, $CH_2Cl_2$, or a wet etching using acid, alkali or the like. However, a dry etching method is preferred. As an etching method using a fluorine containing component, reactive ion etching (RIE) using fluorine gasses such as $CHF_3$, $CF_4$, $SF_6$, $C_2F_6$ and mixtures thereof is preferred.

According to the first aspect of the present invention, the thin film system of phase shift mask or mask blank is free from defects having a particle size of 0.5 μm or more. Preferably, said thin film system has at most 50 defects, more preferably at most 20 defects, having a particle size of 0.3 μm to 0.5 μm. With decreasing feature sizes on a photomask, defects having a size of 500 nm or more will pose a problem and therefore must not be present. With respect to defects having a particle size of 0.3 to 0.5 μm, a limited amount of up to 50 defects per mask blank is tolerable for many applications.

According to the third aspect of the present invention, the phase shift mask blank of the present invention has a high uniformity in view of the phase shift and the transmission on all positions of the mask blank. In particular, the phase shift of said phase shift mask blank has a deviation from the mean value of the phase shift of at most about ±5° and the transmission of said phase shift mask blank has a deviation from the mean transmission value of at most about ±5%.

The substrate material for the phase shift mask according to the present invention preferably is formed of high purity fused silica, fluorine doped fused silica (F—$SiO_2$), calcium fluoride, and the like.

The invention also relates to an attenuating phase shift mask for use in lithography, comprising a substrate and a thin film system on one surface of said substrate; said thin film system comprising:

a phase shift layer comprising a phase shift control sublayer and a transmission control sublayer;

said phase shift mask being able of producing a photomask with substantially 180° phase shift and an optical transmission of at least 0.001% at an exposure light having a wavelength of 200 nm or less, wherein the phase shift control sublayer essentially consists of $SiO_2$ and the transmission control sublayer essentially consists of a metal selected from the group consisting of Ta, Ti, Zr, Hf, V, Nb, Cr, Mo and W; and wherein the thickness of the phase shift control sublayer and the thickness of the transmission control sublayer are selected for efficient performance at an exposure wavelength of 200 nm or less. The metal preferably is Ta. The exposure wavelength preferably is 157 nm or 193 nm.

Also provided is a method of lithography using an exposure wavelength of 200 nm or less, preferably 157 nm or 193 nm, comprising the step of using a mask blank and/or a photomask comprising a substrate and a thin film system on one surface of said substrate; said thin film system comprising:

a phase shift layer comprising a phase shift control sublayer and a transmission control sublayer;

said phase shift mask being able of producing a photomask with substantially 180° phase shift and an optical transmission of at least 0.001% at an exposure light having a wavelength of 200 nm or less, wherein the phase shift control sublayer essentially consists of $SiO_2$ and the transmission control sublayer essentially consists of a metal selected from the group consisting of Ta, Ti, Zr, Hf, V, Nb, Cr, Mo and W.

Preferably, the thickness of the phase shift control sublayer and the thickness of the transmission control sublayer are selected for efficient performance at an exposure wavelength of 200 nm or less, in particular an exposure wavelength of 193 nm or 157 nm. The metal preferably is Ta.

The present invention also relates to a method of manufacturing the inventive phase shift masks or mask blanks for use in lithography comprising:

providing a substrate and a thin film system on one surface of said substrate;

wherein providing said thin film system comprises the steps of:

forming a layer of transmission control sublayer on said substrate;

forming a layer of phase shift control sublayer on said substrate;

said mask blank being capable of producing a photomask blank with substantially 180° phase shift and an optical transmission of at least 0.001% at a selected wavelength of 200 nm or less.

Preferably, the transmission control sublayer and/or the phase shift control layer and or one or more further layers are formed by sputter deposition using a technique selected from the group consisting of dual ion beam sputtering, ion beam assisted deposition, ion beam sputter deposition, RF matching network, DC magnetron, AC magnetron, and RF diode.

According to a preferred embodiment, both sublayers of the phase shift layer and optional further layers are deposited in a single chamber of deposition apparatus without interrupting the ultra high vacuum. It is particularly preferred to deposit both layers of the phase shift layer without interrupting the vacuum. Thus, the decontamination of the mask blank with surface defects is avoided and a phase shift mask blank substantially free of defects can be achieved. Such a sputtering technique can e.g. be realized by using a sputter tool that allows sputtering from several targets. Thus, high quality phase shift masks having a low defect density and/or highly uniform layers with respect to the thickness of the layers can be achieved.

As the sputtering targets, targets comprising elements or targets comprising components can be used. In case the deposited layer contains an oxide, nitride or oxinitride of a metal or semimetal, it is possible to use such oxide, nitride or oxinitride of a metal or semimetal as the target material. However, it is also possible to use a target of a metal or semimetal and to introduce oxygen and/or nitrogen as an active sputtering gas. In case of the deposition of $SiO_2$, it is preferred to use a target of Si and to introduce oxygen as an active gas. In case the deposited layer shall comprise nitrogen, it is preferred to introduce nitrogen as an active sputtering gas.

For the sputtering gas, it is preferred to use inactive gasses such as helium, argon or xenon. Such inactive gasses can be combined with active gasses such as oxygen, nitrogen, nitrogen monoxide, nitrogen dioxide, and dinitrogen oxide or mixtures thereof. Active gasses are gasses that may react with sputtered ions and thus become part of the deposited layer. According to a preferred embodiment of the present invention, during the sputtering of the phase shift control layer, a mixture of an inactive gas and oxygen is used as an additional sputtering gas. In case a phase shift mask blank having a high uniformity of the thickness of the layers and thus the phase shift and/or the transmission is to be provided, it is preferred to use xenon as an inactive sputtering gas. Xe as the sputtering gas results in highly uniform sputtered layers.

Figure 13:
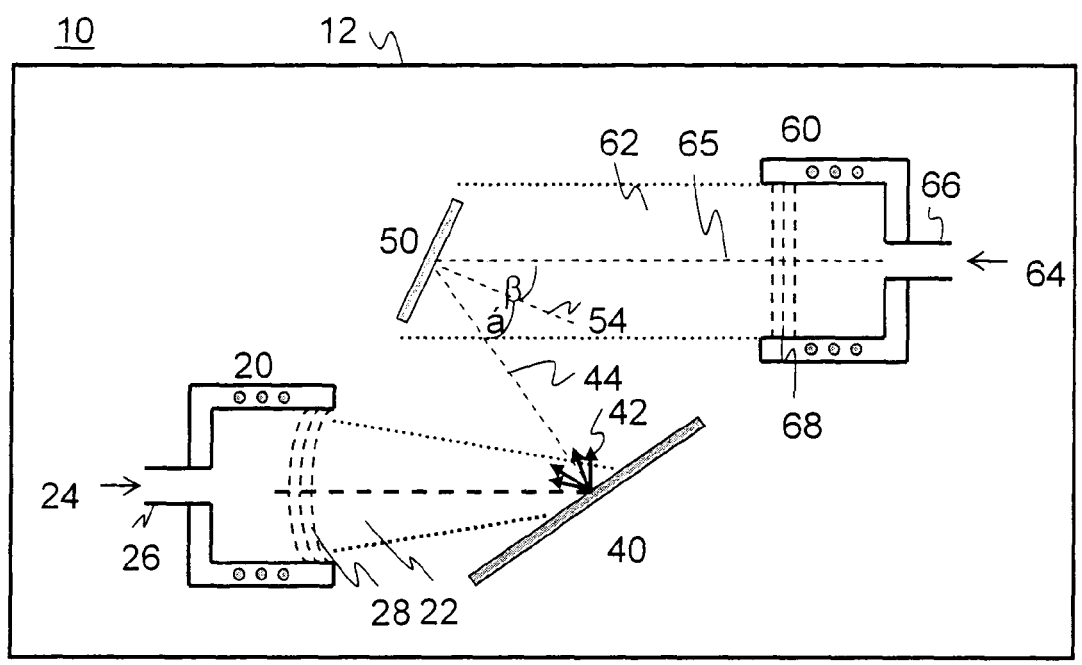
FIG. 13 shows a schematic diagram of a preferred apparatus for fabricating a mask blank according to the present invention.

FIG. 13 schematically shows the setup of a deposition apparatus 10 for manufacturing of photo mask blanks by ion beam sputtering (IBS) or ion beam deposition (IBD) according to a preferred embodiment of the invention. The apparatus 10 comprises a vacuum chamber 12 which can be evacuated by a pump system.

A deposition particle source or more specifically ion deposition source 20 creates a first particle or ion beam 22. The deposition ion source 20 is a high frequency (HF) ion source, however, also other types of ion sources may be used. The sputter gas 24 is led into the deposition ion source 20 at inlet 26 and is ionized inside the deposition ion source 20 by atomic collisions with electrons that are accelerated by an inductively coupled electromagnetic field. A curved three grid ion extraction assembly 28 is used to accelerate the primary ions, comprised in the first ion beam 22 and focus them towards the target 40.

The primary ions are extracted from the deposition ion source 20 and hit a target or sputter target 40, thereby causing cascades of atomic collisions and target atoms are bombed out. This process of sputtering or vaporizing the target is called the sputter process. The sputter target 40 is e.g. a target comprising or consisting of tantalum, titanium, silicon, chrome or any other metal as mentioned above, depending on the layer to be deposited. The deposition apparatus preferably is equipped with a plurality of different sputter targets that differ in respect of the chemical composition in a way that the sputtering process can be changed to another target without the need to interrupt the vacuum. Preferably, the sputter process and the deposition of the layers take place in a suitable vacuum.

Several parameters can be adjusted to influence the momentum transfer function between the primary ions and the target atoms to optimize the laser quality. These method parameters are:

Mass of the primary ions,

Number of the primary ions per second (i.e. the ion current),

Energy of the first ion beam 22, defined by the acceleration voltage,

Incident angle of the first ion beam with respect to target normal line 44,

Density and purity of the target.

The momentum transfer to the target atoms is at largest, when the mass of the primary ions is equivalent to the mass of the target atoms. As noble gases are easy to handle, preferably helium, argon or xenon is used as the sputter gas 24. Xenon is preferred as a sputter gas since the use of Xenon during sputtering increases the uniformity of the thickness of the deposited layers.

The statistical distribution of geometry and energy of the sputtered ions 42 leaving the target as consequence of the momentum transfer in the sputtering process is adjusted or controlled by at least one of the aforesaid method parameters.

In particular, the mean energy of the sputtered atoms, in this case chrome atoms, is adjusted or controlled by the energy and/or the incident angle of the first ion beam 22. The incident angle of the first ion beam 22 with respect to the target normal line 44 is adjusted by pivoting the target 40.

At least a portion of the sputtered ions 42 emerges from the target 40 in the direction of the substrate 50. The sputtered ions 42 hit the substrate 50 with an energy which is much higher than with conventional vapor deposition, deposition or growing highly stable and dense layers or films on the substrate 50.

The substrate 50 is rotatably mounted in a three axis rotation device. The mean incident angle α of the sputtered ions with respect to normal line 54 of the substrate 50 is adjusted by pivoting the substrate 50 around a first axis. By adjusting the incident angle a uniformity, internal film structure and mechanical parameters, in particular film stress can be controlled and consequently improved.

Furthermore, the substrate 50 can be rotated perpendicular to the normal line 54 representing a second axis of rotation, to improve the uniformity of the deposition.

The substrate is additionally rotatable or pivotable around a third axis, allowing it to move the substrate out of the beam to allow for example cleaning of the substrate 50 immediately before deposition.

Furthermore, the apparatus 10 comprises an assist particle source or assist ion source 60. The operation principle is the same as the deposition source 20. A second particle or ion beam 62 is directed towards the substrate 50, e.g. for flattening, conditioning, doping and/or further treatment of the substrate 50 and/or films deposited on the substrate 50. Further active and/or inactive gasses 64 may be introduced via gas inlet 66.

The second ion beam 62 is accelerated by a straight three grid extraction system 68.

The second ion beam 62 substantially covers the whole substrate 50 to obtain a uniform ion distribution or treatment all over the substrate area. The second ion beam 62 is particularly used to dope the films with oxygen, nitrogen, carbon and/or other ions, clean the substrate, for example with an oxygen plasma, before the deposition, improve the interface quality of the films by flattening the films.

Preferably, assist source 60 is used to introduce active gasses such as oxygen and nitrogen to the system.

Depending on the particular treatment, the irradiation of the substrate 50 and/or films deposited on the substrate 50 with the second ion beam 62 can be before, simultaneously and/or after the deposition of films on the substrate 50. As can be seen in FIG. 13 the substrate 50 is tilted by an angle β with respect to the axis 65 of the second ion beam 62.

In the foregoing and in the following examples, all temperatures are set forth uncorrected in degrees Celsius.

The entire disclosure of all applications, patents and publications, cited above and below, is hereby incorporated by reference.

Experiments

In the following, the design and fabrication of mask blanks according to the present invention are described.

Deposition Tool and Parameters

All layers were deposited using a dual ion beam sputtering tool as schematically shown in FIG. 13. In particular, a Veeco Nexus LDD Ion Beam Depostition Tool was used for all depositions.

Table A shows general deposition parameters for the sputtering of the materials used according to the Examples and Comparative Examples:

TABLE A

|  | Ta | SiO$_2$ | SiTiO |
|---|---|---|---|
| Deposition Source |  |  |  |
| Gas | Ar (99.9999%) | Ar (99.9999%) | Ar (99.9999%) |
| Gas flow | 15 sccm | 10 sccm | 10 sccm |
| U-Beam | 1500 V | 800 V | 800 V |
| I-Beam | 400 mA | 200 mA | 200 mA |
| Assist Source |  |  |  |
| Doping Gas | — | O$_2$ (99.9995%) | O$_2$ (99.9995%) |
| Gas flow | 0 | 38 sccm | 38 sccm |
| Other |  |  |  |
| Target material | Ta (99.95%) | Si (99.999%) | SiTi Composite (95% Si; 5% Ti) |

TABLE A-continued

|  | Ta | SiO$_2$ | SiTiO |
|---|---|---|---|
| Deposition rate | 0.57 Å/s | 0.29 Å/s | 0.23 Å/s |
| Background pressure | <3 * 10e−8 Torr | <3 * 10e−8 Torr | <3 * 10e−8 Torr |
| Deposition pressure | ~2 * 10e−4 Torr | ~2 * 10e−4 Torr | ~2 * 10e−4 Torr |

1) Film thickness measured by GIXR after deposition

Ellipsometer Dispersion Data

The n and k values were obtained at 157 and 193 nm from the ellipsometer measurement using a model Woollam VASE Spectroscopic Ellipsometer. Typically, the spectroscopic scan was taken at 55 and 65 degrees. Transmission data was taken to improve the model fitting.

Figure 2:
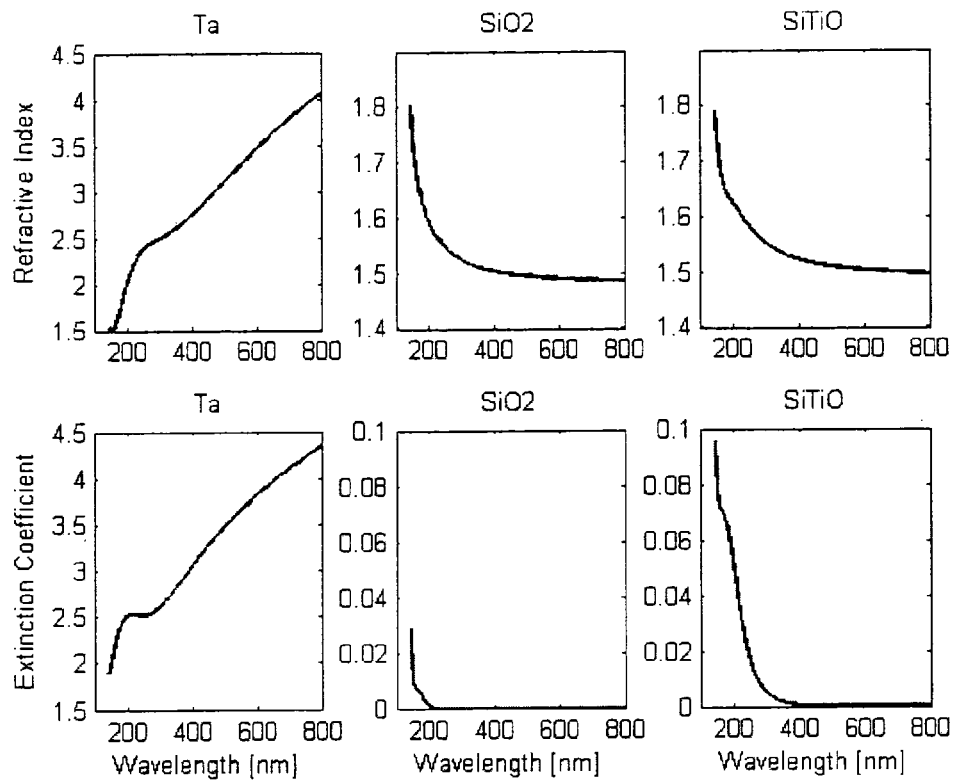
FIG. 2 shows the dispersion curves of Ta, $SiO_2$ and SiTiO.

FIG. 2 shows the dispersion curves of Ta, SiO$_2$ and SiTiO. The columns of FIG. 2 show, form left to right, the measured single layer dispersion curves of Ta, SiO$_2$ and SiTiO. The upper row shows the refractive index n and the lower row the extinction coefficient k.

Table 1 lists the dispersion values at the lithography wavelengths 193 nm and 157 nm of these materials and the F—SiO$_2$ substrate.

TABLE 1

|  | 157 nm | 193 nm |
|---|---|---|
| SiO$_2$ | | |
| n | 1.71 | 1.61 |
| k | 0.008 | 0.002 |
| Substrate | | |
| n | 1.65 | 1.56 |
| k | 0 | 0 |
| SiTiO | | |
| n | 1.72 | 1.63 |
| k | 0.08 | 0.05 |
| Ta | | |
| n | 1.50 | 1.92 |
| k | 2.11 | 2.50 |

These values were used for the following film design of phase shifting mask blanks for 193 nm and 157 nm.

Film Design and Transmission Tuning

The dispersion data of Table 1 above was used to carry out the following calculations. All simulations are based on the widely used matrix algorithm as described in A. Macleod, "Thin-film optical filters", $2^{nd}$ edition, 1986, Bristol, Adam Hilger, for thin films using Matlab for numerical computations. The results of these simulations are shown in FIG. 4.

Figure 4:
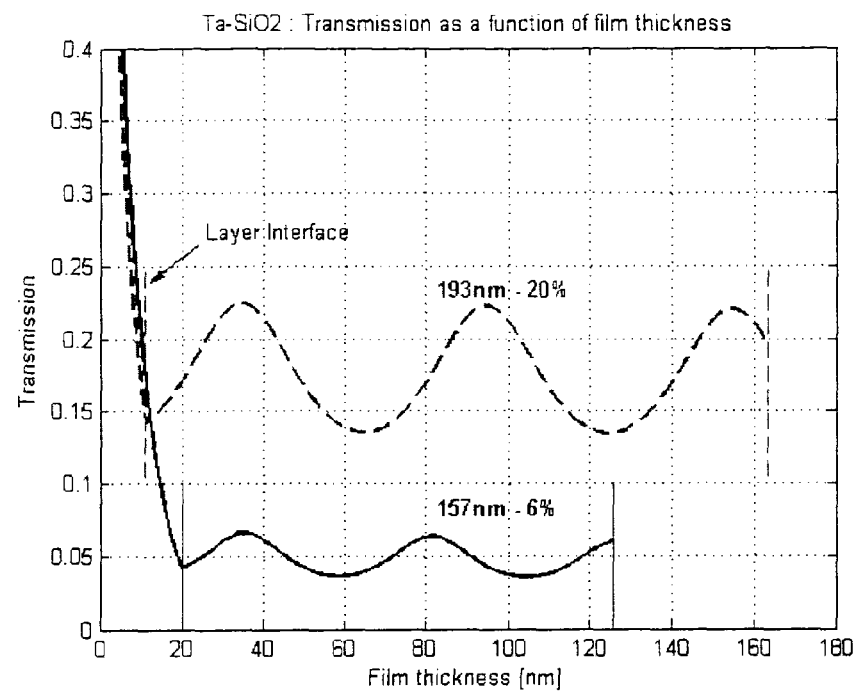
FIG. 4 shows a simulation of the transmission of an exemplary mask blank according to the present invention as a function of the thickness of the transmission control sublayer and the phase shift control sublayer according to a preferred embodiment of the present invention.

FIG. 4 illustrates the design for an attenuated 157 nm (6% transmission) and a high (20%) transmission 193 nm phase shift mask blank. The solid line corresponds to the relation of the transmission to the film thickness of the phase shift sublayers for a wavelength of 157 nm. The dashed line corresponds to the transmission as a function of the film thickness of the phase shift sublayers for a wavelength of a 193 nm phase shift mask blank. Zero film thickness corresponds to the uncoated substrate. On the substrate, a thin Ta layer (11 nm in case of a 193 nm mask blank, 20 nm in case of a 157 nm mask blank) is provided. The graph shows an exponential decrease of transmission with increasing film thickness of the tantalum layer functioning as the transmission control sublayer of the phase shift mask blank. On the thin layer of Ta, a layer of SiO$_2$ is provided as the phase shift control sublayer (152 nm in case of the 193 nm phase shift mask blank, 106 nm in case of the 157 nm mask blank). The interface of the transmission control sublayer to the phase shift control sublayer, is indicated by a thin vertical line. The dielectric SiO$_2$ layer shows the typical oscillations around a mean transmission value caused by interference. At the final interface to air the desired transmission value is achieved. Such a phase shift control sublayer does not substantially change the transmission of the phase shift mask blank but has only a minor contribution to the resulting transmission value. The transmission value for zero film thickness is 1, which is truncated for better resolution.

Figure 5:
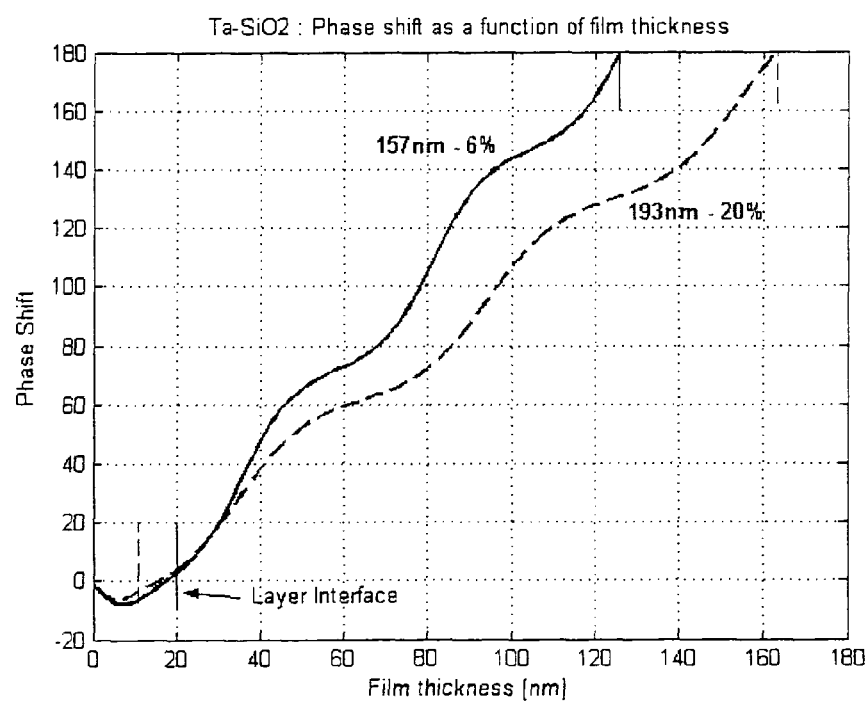
FIG. 5 shows a simulation of phase shift of two exemplary mask blanks according to the present invention as a function of the thickness of the phase shift control sublayer and the transmission control sublayer.

FIG. 5 shows the phase shift as a function of film thickness. Zero film thickness corresponds to zero phase shift. The phase shift of the tantalum layer is first slightly negative, then rises slightly and at the interface is near zero again. Thus, it has negligible contribution to the total phase shift of the phase shift mask blank. In first approximation the dielectric layer produces a linear increase of phase angle with increasing film thickness that is superposed by interference effects. At the final interface to air the desired phase angle of 180° is achieved.

FIGS. 4 and 5 illustrate that a phase shift mask blank allows widely independent control of transmission and phase angle. Adaptation to different wavelengths and transmission requirements is possibly by separately adjusting the thickness of the individual sublayers.

Figure 6A:
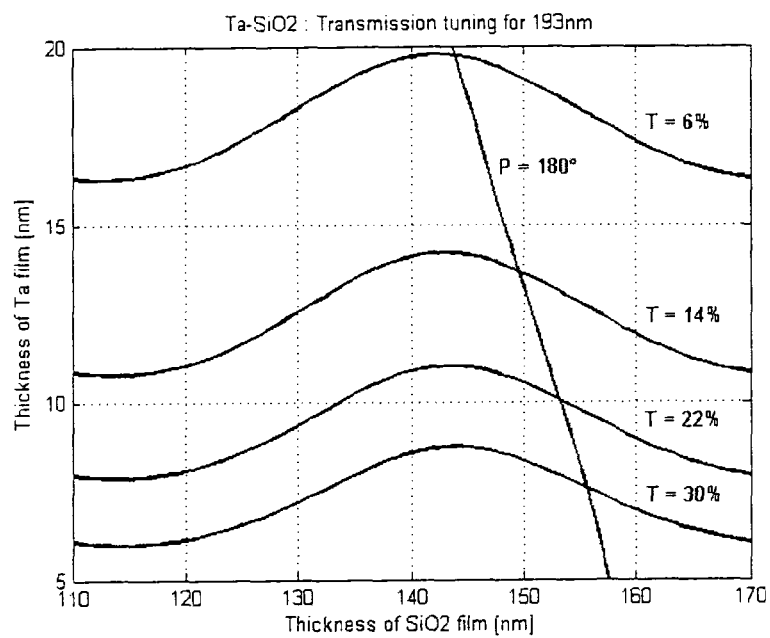
FIG. 6*a* shows a simulation of the variation of the transmission of two exemplary mask blanks according to the present invention depending on the thickness of the transmission control sublayer and the phase shift control sublayer for use at an exposure wavelength of 193 nm.
Figure 6B:
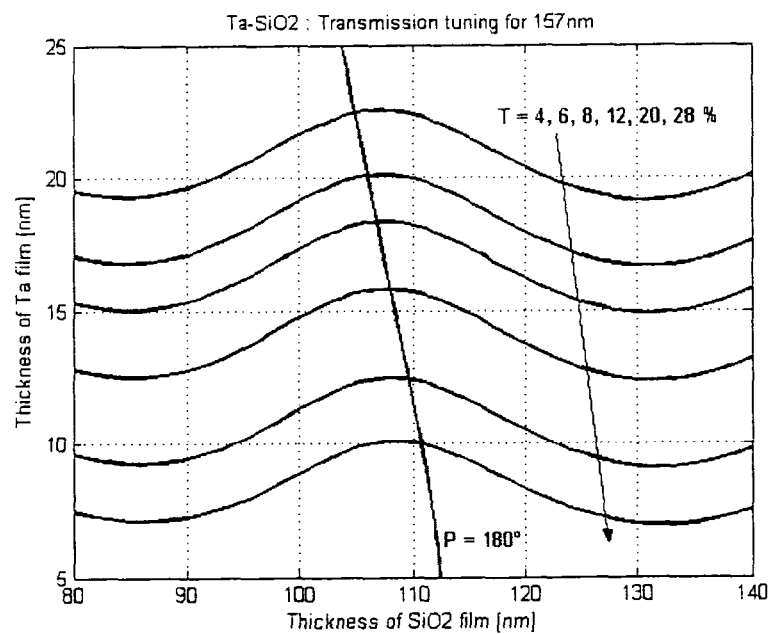
FIG. 6*b* shows a simulation of the variation of the transmission of an exemplary mask blank according to the present invention depending on the thickness of the transmission control sublayer and the phase shift control layer for the use at an exposure wavelength of 157 nm.

FIGS. 6a and 6b illustrate the tunability of the transmission for the two phase shifting systems. On the x-axis the film thickness of SiO$_2$ is provided and on the y-axis the film thickness of tantalum. The approximately vertical solid line indicates all combinations of film thickness of the SiO$_2$-layer and the Ta layer that result in a 180° phase shift. The approximately horizontal graphs correspond to different transmission values corresponding to different sublayer thickness. Line oscillations are caused by interference effects. Such oscillation effects can change the transmission to a substantial amount, however, they do not substantially lower the transmission of the phase shift control sublayer but at most lead to a substantially higher transmission. Since at exposure wavelengths of 200 nm or less, most materials have a very low transmission, an effect such as the described oscillation that may lead to a higher transmission is rather advantageous.

FIG. 6a shows the relation of transmission and phase shift, respectively, to different film thickness for the 193 nm mask blank system. A minimum tantalum layer thickness of 10 nm is assumed in order to work as a reliable etch stop. Under this condition transmission can be tuned up to 22%. FIG. 6b shows the relation of transmission and phase shift, respectively, to different film thickness for the 157 nm mask blank system. A transmission value of 28% can be achieved. For both wavelengths attenuated and high transmission phase shift mask blanks can be produced.

EXAMPLES AND COMPARATIVE EXAMPLE

Mask blanks were fabricated using the above described design for a high transmission attenuating phase shift mask blank for an exposure wavelength of 193 nm and an attenuating phase shift mask blank for an exposure wavelength of 157 nm. Table 2 shows the structure and results of the mask blanks.

TABLE 2

| Substrate | Example 1 quartz | Example 2 F-quartz | Comp. Ex. F-quartz |
|---|---|---|---|
| Transmission control sublayer | | | |
| material | Ta | Ta | Ta |
| thickness | 11 nm | 20 nm | 17 nm |
| transmission Phase shift control sublayer | | | |
| material | $SiO_2$ | $SiO_2$ | SiTiO |
| thickness | 152 | 106 | 105 |
| Phase shift mask blank | | | |
| exposure wavelength | 193 nm | 157 nm | 157 nm |
| transmission at exposure wavelength | 20% | 6% | 6% |
| phase shift | 180° | 180° | 180° |

Laser Durability

Laser durability tests were performed by the Lambda Physik LPX120 with a Novatube for 157 nm applications. The repetition rate during the tests was 50 Hz at a fluence of about 2 mJ/cm² per pulse. The experimental chamber was made of stainless steel and purged with 99.999 $N_2$ gas and maintained at an $O_2$ level of less than 1.0 ppm during the irradiation. The transmission measurement scheme deployed a dual beam measurement (main beam and reference beam) with a beam splitter. The energy probes to monitor the laser pulse was made by Star Tech Instruments (model PV16C). The result was complimentary to the transmission measurement done by the Woollam Ellipsometer before and after the radiation.

Figure 3:
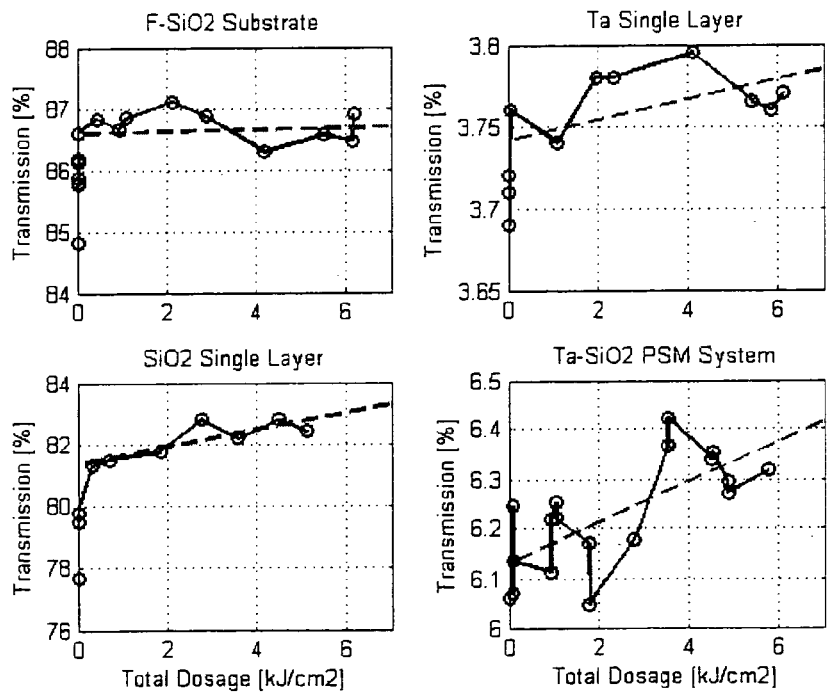
FIG. 3 shows the results of laser durability measurements of an $F-SiO_2$ substrate, a Ta single layer on an $F-SiO_2$, an $SiO_2$ single layer on an $F-SiO_2$ substrate and an exemplary phase shift mask blank according to the present invention.

FIG. 3 shows the in-situ transmission measurements of the F—$SiO_2$ substrate, Ta and $SiO_2$ single layers and the complete Ta—$SiO_2$ phase shift mask blank. Most of the transmission change occurs immediately after radiation start. This is likely due to the surface contamination removal. The in-situ transmission measurements show also significant noise. Therefore transmission measurements using the Woollam Ellipsometer were carried out to determine the transmission change and therefore laser stability of the samples. The results are shown in Table 3.

TABLE 3

| | Before Laser | After Laser |
|---|---|---|
| F—$SiO_2$ | 83.8% | 84.4% |
| Ta | 3.83% | 3.92% |
| $SiO_2$ | 74.3% | 80.9% |
| Ta—$SiO_2$ | 6.32% | 6.51% |

Table 3 shows the transmission measured by Ellipsometer before and after radiation. The value of the fluorine doped fused silica substrate (F—$SiO_2$) was used to confirm the validity of the measurements. The before radiation value by Woollam gave 83.8% which is in good agreement with the in-situ transmission value (84.8%) while the Woollam transmission after 6 kJ/cm² dosage gave 84.4% which is a much smaller value than the in-situ transmission value (86.7%). However, since most of the transmission change induced by the laser is likely due to the surface contamination removal (mainly water) it is plausible that as soon as the sample is exposed to the normal lab environment the surface is re-contaminated giving values comparable to the transmission before radiation.

The in-situ transmission values shown in FIG. 3 for Ta and Ta—$SiO_2$ films show significant noise. This is typically observed for our set up at small transmission ranges due to the limit of the dynamic range of the instrument. However, the laser stability of the Ta—$SiO_2$ is very good as shown on the table, transmission changing from 6.32% to 6.51% after 5.8 kJ/cm² dosage.

Chemical Durability

Figure 7A:
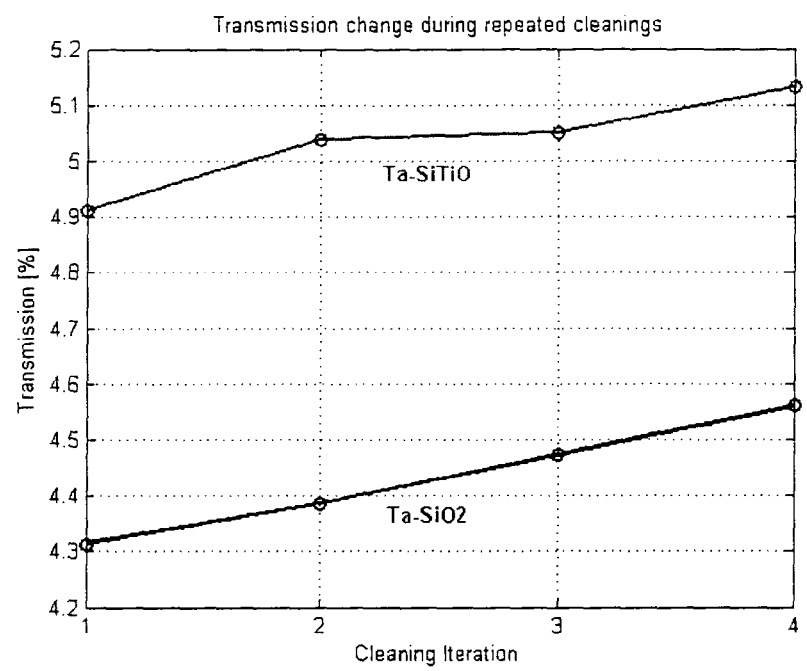
FIG. 7*a* shows the transmission change of an exemplary mask blank according to the present invention during repeated cleaning cycles.
Figure 7B:
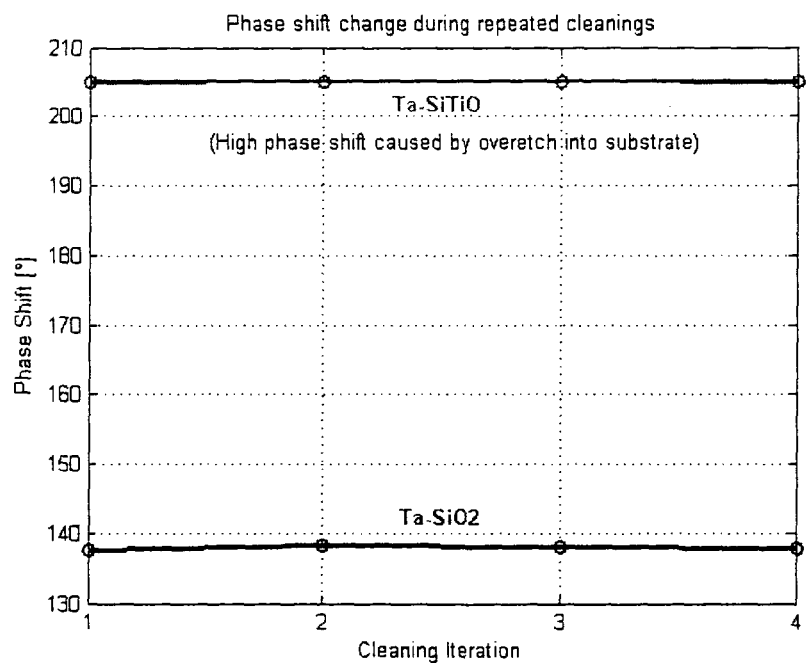
FIG. 7*b* shows the phase shift change of an exemplary mask blank according to the present invention during repeated cleaning cycles.

The effect of cleaning on the transmission and the phase shift is an important feature of any attenuating phase shift mask blank. Cleaning the mask should not alter the phase shift or transmission significantly. To test the effect of cleaning on the phase shift mask blank according to the Example, a patterned Ta—$SiO_2$ phase shift mask blank (Example 2) and a patterned Ta—SiTiO phase shift mask blank (Comparative Example 1) were subjected to repeated cleaning cycles. Each plate was cleaned using a sulfuric acid peroxide mixture at 90° C. and rinsed with a dilute ammonia rinse. The phase shift and transmission were then measured using the MPM 193. At least one day was allowed to elapse before the next cleaning cycle to minimize any effect of potential native oxides. Each mask went through four cleaning cycles for this part of the film characterization testing. FIGS. 7a and 7b show the results of these experiments.

The results of the repetitive cleaning tests shown in FIGS. 7a and 7b indicate that the effect of multiple cleans has minimal effects on the phase shift (~0.25° loss per clean) and a slight increase in transmission (~0.08% points increase per clean). Both phase shift mask blanks are acceptable from a cleaning perspective.

Uniformity of Phase Shift and Transmission

The Examples were analyzed using two different methods. The first method is a thickness fit using a N&K photo spectrometer. Using fixed dispersion values the spectrometer calculates the film thickness out of the measured reflection and transmission data. Generally this method is more precise for dielectric layers than for metallic layers. To improve the fit quality for metallic layers dispersion fits were carried out using a fixed film thickness measured before by grazing incidence x-ray reflectometry. FIGS. 8a and 8b show the result of a mask blank according to example 2 wherein the phase shift layer has been deposited using argon as the sputtering gas.

FIG. 8a shows a contour plot of the tantalum layer thickness measured in a 140 mm×140 mm area. The range/mean uniformity value including the corners is 5.4%. Excluding the corner points the value is 2.9%.

FIG. 8b shows the contour plot for the $SiO_2$ layer. Here the range/mean uniformity value including the corners is 6.5%. Excluding the corner points the value is 3.2%.

After structuring of the mask blank for the measurement by MPM193, transmission and phase shift uniformity were measured by MPM193. FIGS. 9a and 9b show the results. FIG. 9a shows the measured transmission uniformity. The mean value is 4.3% and three sigma is 0.6%. FIG. 9b shows the measured phase angle uniformity. The mean value is 137.5° and three sigma is 3.6°. FIGS. 9a and 9b show the same rotation symmetric distribution as the contour plots in FIGS. 8a and 8b. The non uniformity of transmission and phase shift is explained by the film thickness non uniformity.

Figure 10:
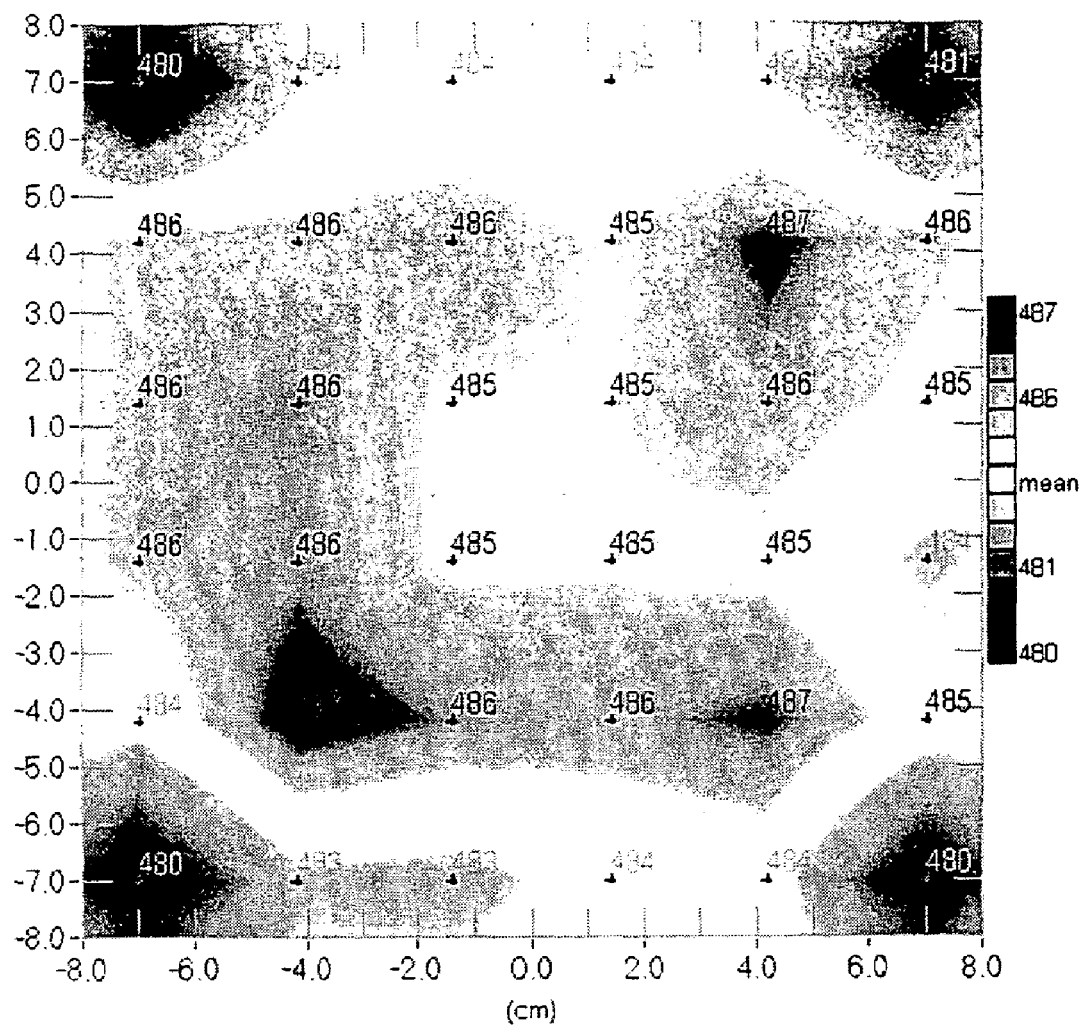
FIG. 10 shows the uniformity of the thickness of the phase shift control layer of a further exemplary mask blank according to the present invention.

The film uniformities can be improved by sputtering with Xenon. FIG. 10 shows a contour plot of such an improved mask blank according to Example 2. The thickness non-uniformity of the $SiO_2$ layer is improved by a factor of four. The range/mean value including the corners is now only 1.4%. This will already yield a phase shift uniformity of ±1.3°.

Measurement of Defect Levels

Defects levels were measured using a high resolution laser scanner defect inspection tool. Both surfaces of the blank are scanned line by line by a laser beam. The reflected and transmitted stray light is detected by two photo multipliers. The software calculates class, location and size of the particles out of the four measured signals. The results are displayed as location maps and size histograms. In the maps particle sizes are reduced to three classes, i.e. particles from about 0.2 to 0.5 µm, particles between 0.5 µm and 1 µm and particles above 1 µm. Dots indicate particles from about 0.2 to 0.5 µm, circles and squares would indicate particles of larger particle sizes.

Figure 11:
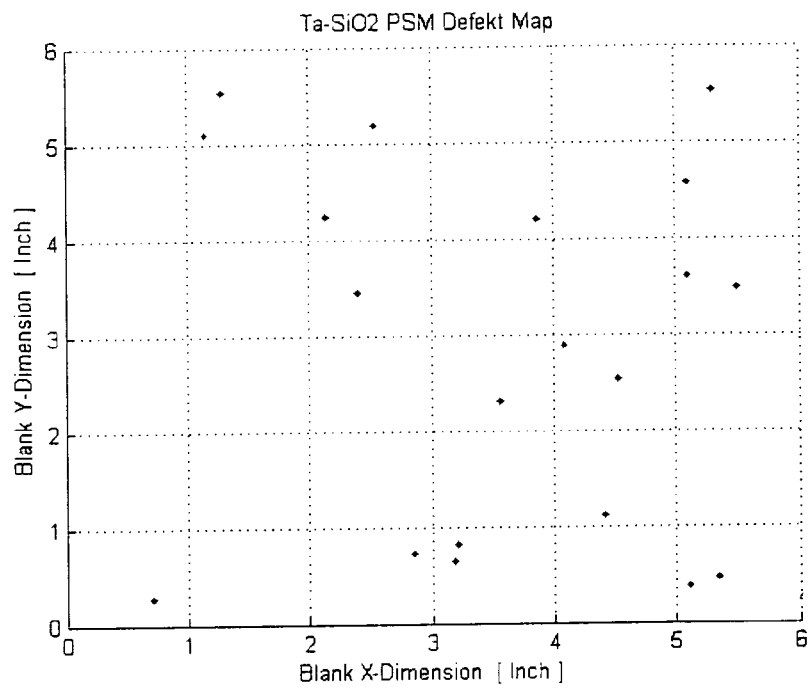
FIG. 11 shows a defect map of an exemplary mask blank according to the present invention and FIG. 12 shows a particle size histogram of this mask blank.
Figure 12:
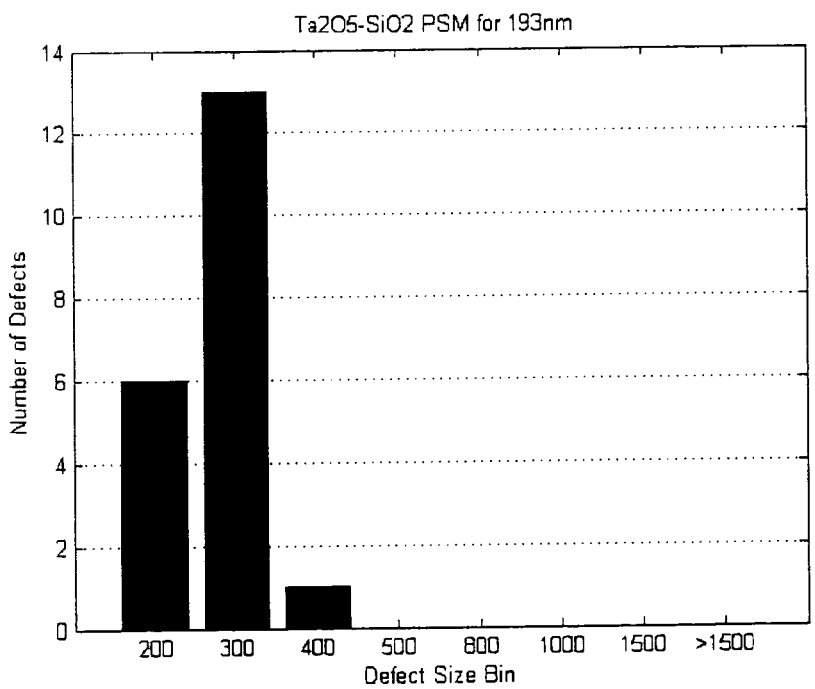

FIGS. 11 and 12 show the particle level of an inventive phase shift mask blank according to Example 2. FIG. 11 shows the particle map and FIG. 12 the size distribution histogram. The total number of particles having a particle size of 0.3 to 0.5 µm is only 14 and no particles having a particle size above 0.5 µm were detected.

A phase shift mask blank according to the Comparative Example showed particles having a particle size of between 0.5 µm and 1 µm and even of above 1 µm. It is assumed that the titanium atoms inside the matrix function as seeds for particles.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. An attenuating phase shift mask for use in lithography, comprising a substrate and a thin film system on one surface of said substrate; said thin film system comprising:
  a phase shift layer comprising a phase shift control sublayer and a transmission control sublayer;
  said phase shift mask being suitable for use in producing a photomask with substantially 180° phase shift and an optical transmission of at least 0.001% at an exposure light having a wavelength of 200 nm or less;
  wherein said thin film system is essentially free of defects having a particle size of 0.5 µm or more, and said transmission control sublayer comprises a material selected from the group consisting of Mg, Y, La, Ti, Zr, Hf, V, Nb, Ta, Cr, Mo, W, Mn, Fe, Co, Ni, Zn, Ge, Sn, Pb, nitrides thereof and mixtures of two or more of these metals or nitrides.

2. The phase shift mask according to claim 1, wherein the thin film system has at most 50 defects having a particle size of from 0.3 to 0.5 µm.

3. The phase shift mask according to claim 1, wherein the thin film system has at most 20 defects having a particle size of from 0.3 to 0.5 µm.

4. The phase shift mask according to claim 1, wherein said phase shift control sublayer substantially does not change the transmission of the phase shift mask.

5. The phase shift mask according to claim 1, wherein said phase shift control sublayer comprises a material selected from the group consisting of oxides and oxy nitrides of Si.

6. The phase shift mask blank according to claim 5, wherein said transmission control sublayer essentially consists of one material selected from Ti, Zr, Hf, V, Nb, Ta, Cr, Mo, W and nitrides thereof.

7. The phase shift mask blank according to claim 6, wherein said transmission control sublayer essentially consists of one material selected from Ti, Zr, Hf, V, Nb, Ta, Cr, Mo, and W.

8. The phase shift mask according to claim 1, wherein said phase shift control sublayer essentially consists of $SiO_2$.

9. The phase shift mask blank according to claim 8, wherein said transmission control sublayer essentially consists of one material selected from Ti, Zr, Hf, V, Nb, Ta, Cr, Mo, W and nitrides thereof.

10. The phase shift mask blank according to claim 9, wherein said transmission control sublayer essentially consists of one material selected from Ti, Zr, Hf, V, Nb, Ta, Cr, Mo, and W.

11. The phase shift mask blank according to claim 8, wherein said phase shift control sublayer has a thickness of at least 130 nm and at most about 180 nm.

12. The phase shift mask blank according to claim 11, wherein said phase shift control sublayer has a thickness of at least 145 nm and at most 160 nm.

13. The phase shift mask blank according to claim 8, wherein said phase shift control sublayer has a thickness of at least 90 nm and at most 120 nm.

14. The phase shift mask blank according to claim 13, wherein said phase shift control sublayer has a thickness of at least 100 nm and at most 110 nm.

15. The phase shift mask according to claim 1, wherein said transmission control sublayer substantially does not change the phase shift of the phase shift mask.

16. The phase shift mask blank according to claim 1, wherein said transmission control sublayer essentially consists of one material selected from Ti, Zr, Hf, V, Nb, Ta, Cr, Mo W and nitrides thereof.

17. The phase shift mask blank according to claim 16, wherein said transmission control sublayer essentially consists of one material selected from Ti, Zr, Hf, V, Nb, Ta, Cr, Mo, and W.

18. A method of fabricating an attenuated phase shift mask according to claim 1, said method comprising:
  providing a substrate; and
  providing a thin film system, wherein providing of a thin film system comprises
    forming a transmission control sublayer on said substrate; and
    forming a phase shift control sublayer on said substrate.

19. The phase shift mask blank according to claim 1, wherein said phase shift layer consists of said phase shift control sublayer and said transmission control sublayer.

20. The phase shift mask blank according to claim 1, wherein said transmission control sublayer has a thickness of at least 8 nm.

21. An attenuating phase shift mask for use in lithography, comprising a substrate and a thin film system on one surface of said substrate; said thin film system comprising:
  a phase shift layer comprising a phase shift control sublayer and a transmission control sublayer;
  said phase shift mask being suitable for use in producing a photomask with substantially 180° phase shift and an optical transmission of at least 0.001% at an exposure light having a wavelength of 200 nm or less;
  wherein the phase shift of said phase shift mask has a deviation from the mean value of at most about ±520 and the transmission of said phase shift mask has a deviation from the mean transmission value of at most about ±5%.

22. The phase shift mask according to claim 21, wherein said phase shift control sublayer substantially does not change the transmission of the phase shift mask.

23. The phase shift mask according to claim 21, wherein said phase shift control sublayer comprises a material selected from the group consisting of oxides and oxy nitrides of Si.

24. The phase shift mask according to claim 21, wherein said phase shift control sublayer essentially consists of $SiO_2$.

25. The phase shift mask according to claim 21, wherein said transmission control sublayer substantially does not change the phase shift of the phase shift mask.

26. The phase shift mask according to claim 21, wherein said transmission control sublayer comprises a material selected from the group consisting of Mg, Si, Y, La, Ti, Zr, Hf, V, Nb, Ta, Cr, Mo, W, Mn, Fe, Co, Ni, Zn, Ge, Sn, Pb, nitrides thereof and mixtures of two or more of these metals or nitrides.

27. The phase shift mask blank according to claim 26, wherein said transmission control sublayer essentially consists of one material selected from Ti, Zr, Hf, V, Nb, Ta, Cr, Mo, W or nitrides thereof.

28. A method of fabricating an attenuated phase shift mask according to claim 21, said method comprising:
providing a substrate; and
providing a thin film system, wherein providing of a thin film system comprises
forming a transmission control sublayer on said substrate, and
fonning a phase shift control sublayer on said substrate.

29. The method according to claim 28, wherein the transmission control sublayer is formed by sputter deposition using a technique selected from the group consisting of dual ion beam sputtering, ion beam assisted deposition, ion beam sputter deposition, RF matching network, DC magnetron, AC magnetron, and RF diode.

30. The method according to claim 28, wherein the phase shift control sublayer is formed by sputter deposition using a technique selected from the group consisting of dual ion beam sputtering, ion beam assisted deposition, ion beam sputter deposition, RF matching network, DC magnetron, AC magnetron, and RF diode.

31. The method according to claim 28, wherein xenon is used as a sputtering gas.

32. An attenuating phase shift mask for use in lithography, comprising a substrate and a thin film system on one surface of said substrate; said thin film system comprising:
a phase shift layer comprising a phase shift control sublayer and a transmission control sub layer;
said phase shift mask being suitable for use producing a photomask with substantially 180° phase shift and an optical transmission of at least 0.001% at an exposure light having a wavelength of 200 nm or less;
wherein said thin film system is essentially free of defects having a particle size of 0.5 μm or more, and wherein said thin film system has at most 50 defects having a particle size of from 0.3 to 0.5 μm.

33. The phase shift mask according to claim 32, wherein the thin film system has at most 20 defects having a particle size of from 0.3 to 0.5 μm.

34. The phase shift mask according to claim 32, wherein said phase shift control sublayer substantially does not change the transmission of the phase shift mask.

35. The phase shift mask according to claim 32, wherein said phase shift control sublayer comprises a material selected from the group consisting of oxides and oxy nitrides of Si.

36. The phase shift mask according to claim 32, wherein said phase shift control sublayer essentially consists of $SiO_2$.

37. The phase shift mask according to claim 32, wherein said transmission control sublayer substantially does not change the phase shift of the phase shift mask.

38. The phase shift mask according to claim 32, wherein said transmission control sublayer comprises a material selected from the group consisting of Mg, Si, Y, La, Ti, Zr, Hf, V, Nb, Ta, Cr, Mo, W, Mn, Fe, Co, Ni, Zn, Ge, Sn, Pb, nitrides thereof and mixtures of two or more of these metals or nitrides.

39. The phase shift mask blank according to claim 38, wherein said transmission control sub layer essentially consists of one material selected from Ti, Zr, Hf, V, Nb, Ta, Cr, Mo, W and nitrides thereof.

40. The phase shift mask blank according to claim 39, wherein said transmission control sublayer essentially consists of one material selected from Ti, Zr, Hf, V, Nb, Ta, Cr, Mo, and W.

41. The phase shift mask blank according to claim 32, wherein said phase shift layer consists of said phase shift control sublayer and said transmission control sublayer.

42. An attenuating phase shift mask for use in lithography, comprising a substrate and a thin film system on one surface of said substrate; said thin film system comprising:
a phase shift layer consists of a phase shift control sublayer and a transmission control sublayer;
said phase shift mask being suitable for use producing a photomask with substantially 180° phase shift and an optical transmission of at least 0.001% at an exposure light having a wavelength of 200 nm or less;
wherein said thin film system is essentially free of defects having a particle size of 0.5 μm or more.

43. The phase shift mask according to claim 42 wherein the thin film system has at most 20 defects having a particle size of from 0.3 to 0.5 μm.

44. The phase shift mask according to claim 42, wherein said phase shift control sublayer substantially does not change the transmission of the phase shift mask.

45. The phase shift mask according to claim 42, wherein said phase shift control sublayer comprises a material selected from the group consisting of oxides and oxy nitrides of Si.

46. The phase shift mask according to claim 42, wherein said phase shift control sublayer essentially consists of $SiO_2$.

47. The phase shift mask according to claim 42, wherein said transmission control sublayer substantially does not change the phase shift of the phase shift mask.

48. The phase shift mask according to claim 42, wherein said transmission control sublayer comprises a material selected from the group consisting of Mg, Si, Y, La, Ti, Zr, Hf, V, Nb, Ta, Cr, Mo, W, Mn, Fe, Go, Ni, Zn, Ge, Sn, Pb, nitrides thereof and mixtures of two or more of these metals or nitrides.

49. The phase shift mask blank according to claim 48, wherein said transmission control sublayer essentially consists of one material selected from Ti, Zr, Hf, V, Nb, Ta, Cr, Mo, W and nitrides thereof.

50. The phase shift mask blank according to claim 49, wherein said transmission control sublayer essentially consists of one material selected from Ti, Zr, Hf, V, Nb, Ta, Cr, Mo, and W.

* * * * *

UNITED STATES PATENT AND TRADEMARK OFFICE
CERTIFICATE OF CORRECTION

PATENT NO.       : 7,029,803 B2                                             Page 1 of 1
APPLICATION NO.  : 10/655593
DATED            : April 18, 2006
INVENTOR(S)      : Becker et al.

It is certified that error appears in the above-identified patent and that said Letters Patent is hereby corrected as shown below:

Column 18, line 34, reads "Mo W and" should read -- Mo, W and --
Column 18, line 64, reads "about ±520" should read -- about ±5° --
Column 19, line 30, reads "fonning" should read -- forming.--
Column 19, line 49, reads "sub layer" should read -- sublayer --
Column 19, line 50, reads "use producing" should read -- use in producing --
Column 20, line 13, reads "sub layer" should read -- sublayer --
Column 20, line 27, reads "layer consists of" should read -- layer consisting of --
Column 20, line 29, reads "use producing" should read -- use in producing --
Column 20, line 31, reads "0.00 1%" should read -- 0.001% --
Column 20, line 54, reads "Fe, Go," should read -- Fe, Co, --

Signed and Sealed this

Thirtieth Day of January, 2007

JON W. DUDAS
*Director of the United States Patent and Trademark Office*